United States Patent
Liu

(10) Patent No.: US 7,321,753 B2
(45) Date of Patent: Jan. 22, 2008

(54) WIRELESS TRANSMISSION CIRCUIT ENABLING MODULATION OF RADIO FREQUENCY POWER AMPLIFICATION

(75) Inventor: Zhi-Min Liu, San Chung (TW)

(73) Assignee: Kye Systems Corp., Taipei Hsien (TW)

( * ) Notice: Subject to any disclaimer, the term of this patent is extended or adjusted under 35 U.S.C. 154(b) by 795 days.

(21) Appl. No.: 10/104,123

(22) Filed: Mar. 21, 2002

(65) Prior Publication Data
US 2003/0083026 A1 May 1, 2003

(30) Foreign Application Priority Data
Oct. 26, 2001 (TW) .............................. 90218400 U

(51) Int. Cl.
*H04B 1/04* (2006.01)
*G09G 5/08* (2006.01)

(52) U.S. Cl. .............................. 455/127.3; 455/127.1; 455/127.2; 455/126; 345/163

(58) Field of Classification Search ............. 455/127.2, 455/127.1, 127.3, 126; 345/163
See application file for complete search history.

(56) References Cited

U.S. PATENT DOCUMENTS

| 6,400,301 | B1* | 6/2002 | Kulhalli et al. ............. 341/155 |
|---|---|---|---|
| 6,630,867 | B2* | 10/2003 | Canyon et al. ............. 330/297 |
| 6,681,101 | B1* | 1/2004 | Eidson et al. ............. 455/127.1 |
| 6,687,511 | B2* | 2/2004 | McGowan et al. ......... 455/522 |
| 6,697,617 | B2* | 2/2004 | Liebenow .................... 455/425 |
| 6,775,525 | B1* | 8/2004 | Tanoue et al. ........... 455/127.3 |
| 6,845,246 | B1* | 1/2005 | Steer .......................... 455/522 |
| 6,933,922 | B2* | 8/2005 | Casebolt et al. ............ 345/157 |

* cited by examiner

*Primary Examiner*—Nay Maung
*Assistant Examiner*—Richard Chan
(74) *Attorney, Agent, or Firm*—Pro-Techtor Int'l Services

(57) ABSTRACT

A wireless transmission circuit enabling modulation of RF power amplification includes a signal processing circuit for outputting a signal that is modulated and then amplified at a cascade power amplification circuit including a plurality of power stages, and is then wirelessly transmitted to and received by a computer system. The wireless transmission circuit includes at least a power-setting unit for controlling a specific number of power stages included in the power amplification circuit to be used in the power amplification of the modulated signal. When a wireless input device employing the wireless transmission circuit is used within a short transmission distance, a lower transmission power is selected via the power-setting unit; and when the wireless input device is used at a long transmission distance, a higher transmission power may be selected to achieve the remote transmission. The wireless input device could therefore have extended battery life.

3 Claims, 4 Drawing Sheets

WIRELESS TRANSMISSION CIRCUIT ENABLING MODULATION OF RADIO FREQUENCY POWER AMPLIFICATION

BACKGROUND OF THE INVENTION

1. Field of the Invention

The present invention relates to a wireless transmission circuit, and more particularly to a wireless transmission circuit enabling modulation of radio frequency (RF) power amplification.

2. Description of the Prior Art

Various input devices for a computer system in the early stage, such as mouse, keyboard, joystick, track ball, etc., send their input data to the computer system via a data transmission interface, such as a serial port, a parallel port or a universal serial bus (USB). On receipt of the data input from the input devices, the computer system immediately performs corresponding actions.

With the quickly developed computer technologies, the peripherals of a computer system also involve in very high level of electronic technologies. The constant development of RF transmission technique enables many wireless input devices, such as wireless mouse, wireless keyboard, wireless joystick, etc., to become very popular in the markets. Since these wireless input devices are not able to obtain a working current source from the computer system via cables, they must have batteries mounted therein to obtain the required working current source.

To ensure normal usage of wireless devices, it is important for them to have a durable battery life. There is a close relation between the battery life and a consumed power of a wireless device. The wireless device would require different RF transmission powers at an output thereof depending on actual working conditions, such as a distance between a transmission end and a reception end, the material of surrounding working environment, etc. Moreover, the problem of RF interference becomes serious when the wireless devices become highly popular among users. All these problems should be taken into consideration when designing the wireless devices, in order to decrease the use of the battery and avoid mutual interference of RF signals.

SUMMARY OF THE INVENTION

A primary object of the present invention is to provide an adjustable RF transmission control circuit for a wireless device. When the wireless device is used to work within a short distance, a lower transmission power may be selected for it; and when the wireless device is used in remote transmission, a higher transmission power may be selected. In this manner, the battery of the wireless device could have an extended usable life and meet the requirement of remote transmission.

Another object of the present invention is to provide a wireless transmission circuit enabling modulation of RF power amplification, in which techniques related to adjustable RF transmission power is employed to achieve the purpose of reduced power consumption of a wireless device and accordingly, extended usable life of battery for the wireless device.

To achieve the above and other objects, the wireless transmission circuit enabling modulation of RF power amplification according to the present invention mainly includes a cascade power amplification circuit including a plurality of power stages, and a power-setting unit. One or more of the power stages in the cascade power amplification circuit may be set via the power-setting unit to amplify the power of a modulated signal output by a signal modulator-oscillator stage before the cascade power amplification circuit. A user may use the power-setting unit to decide a specific number of power stages in the cascade power amplification circuit that are to be used in the power-amplification of the modulated signal according to a required transmission power and a transmission distance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
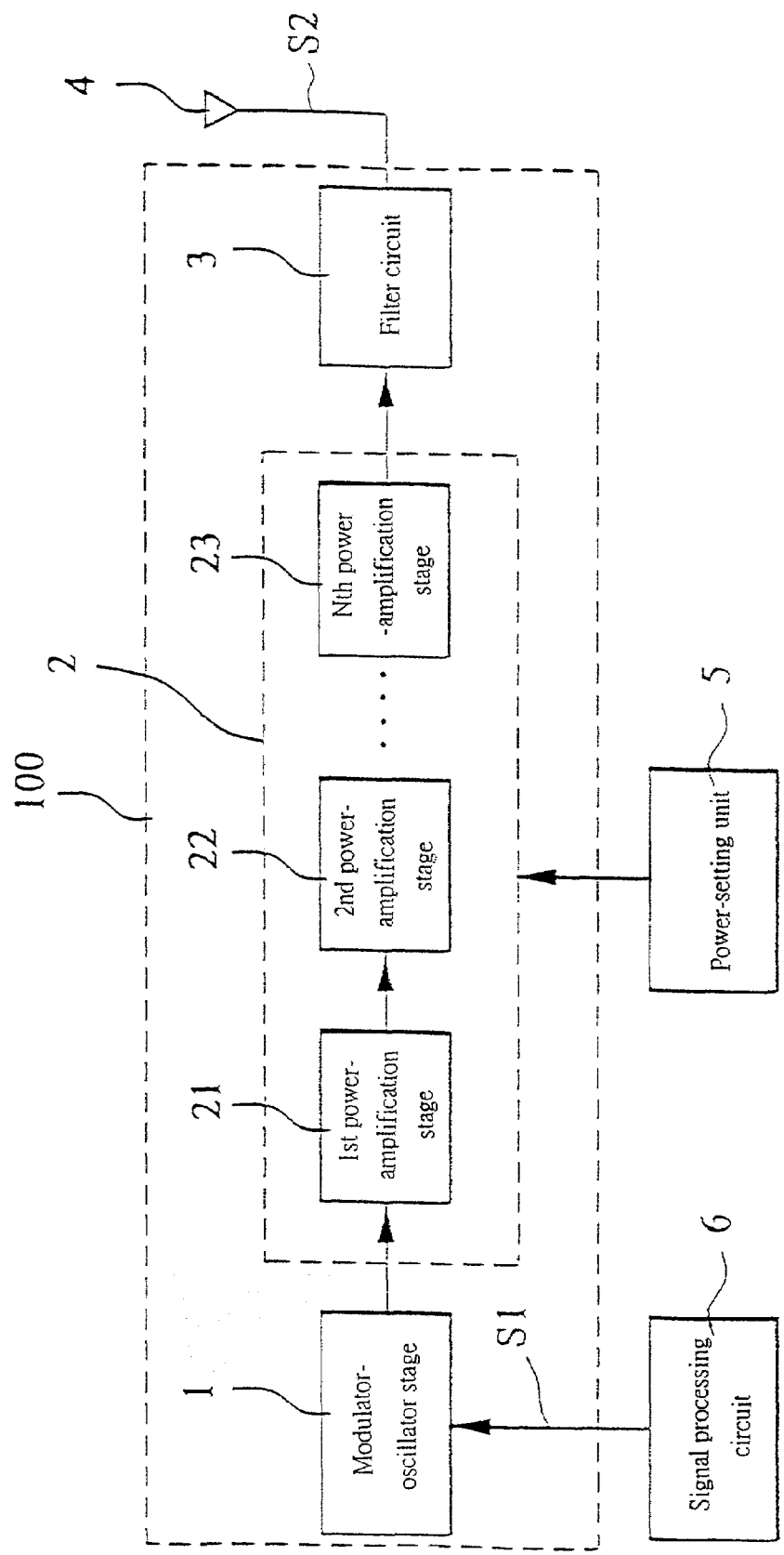
FIG. 1 is a block diagram explaining the circuit function of the present invention.

Please refer to FIG. 1 that is a block diagram explaining the circuit function of a wireless transmission circuit 100 enabling modulation of RF power amplification. The wireless transmission control circuit 100 mainly includes a signal modulator-oscillator stage 1, a cascade power amplification circuit 2, a filter circuit 3, an antenna 4, and a power-setting unit 5. An input of the signal modulator-oscillator stage 1 is connected to a signal processing circuit 6 for receiving an input signal S1 output by the signal processing circuit 6.

The signal processing circuit 6 may be any signal processing circuit for a mouse, a keyboard, a joystick, a track ball, a game controller, a digital signal camera/PC camera, a digital signal video camera/PC video camera, or any other input device or pointing device for generating the input signal S1. The input signal S1 is first sent to the signal modulator-oscillator stage 1 of the wireless transmission control circuit 100, at where the input signal S1 is modulated and then sent to the cascade power amplification circuit 2, at where a RF power of the modulated signal data is amplified.

The cascade power amplification circuit 2 includes a plurality of cascade-connected power stages 21, 22 . . . , 2n. For example, the cascade power amplification circuit 2 may include two power stages 21 and 22. In practical application of the present invention, more power stages could be included through cascade connection to achieve more stages of power amplification.

Taking a two-stage cascade power amplification circuit 2 as an example, a first power stage 21 thereof has an input connected to an output of the signal modulator-oscillator stage 1, and an output connected to an input of a second power stage 22; and an output of the second power stage 22 is connected to an input of the filter circuit 3.

The power-setting unit 5 is used to control the power amplification performed through the cascade power amplification circuit 2. That is, the power-setting unit 5 may be manually or automatically set to select only the first power stage 21 or both the first and the second power stages 21, 22 to execute the power amplification.

When the filter circuit 3 receives an amplified signal from the second power stage 22, it executes filtration of the received signal and generates a filtered RF signal S2 at an output thereof.

The filtered signal S2 is emitted from the antenna 4, and could be received by a RF-signal-receiving device that is located within an effective reception range.

Figure 2:
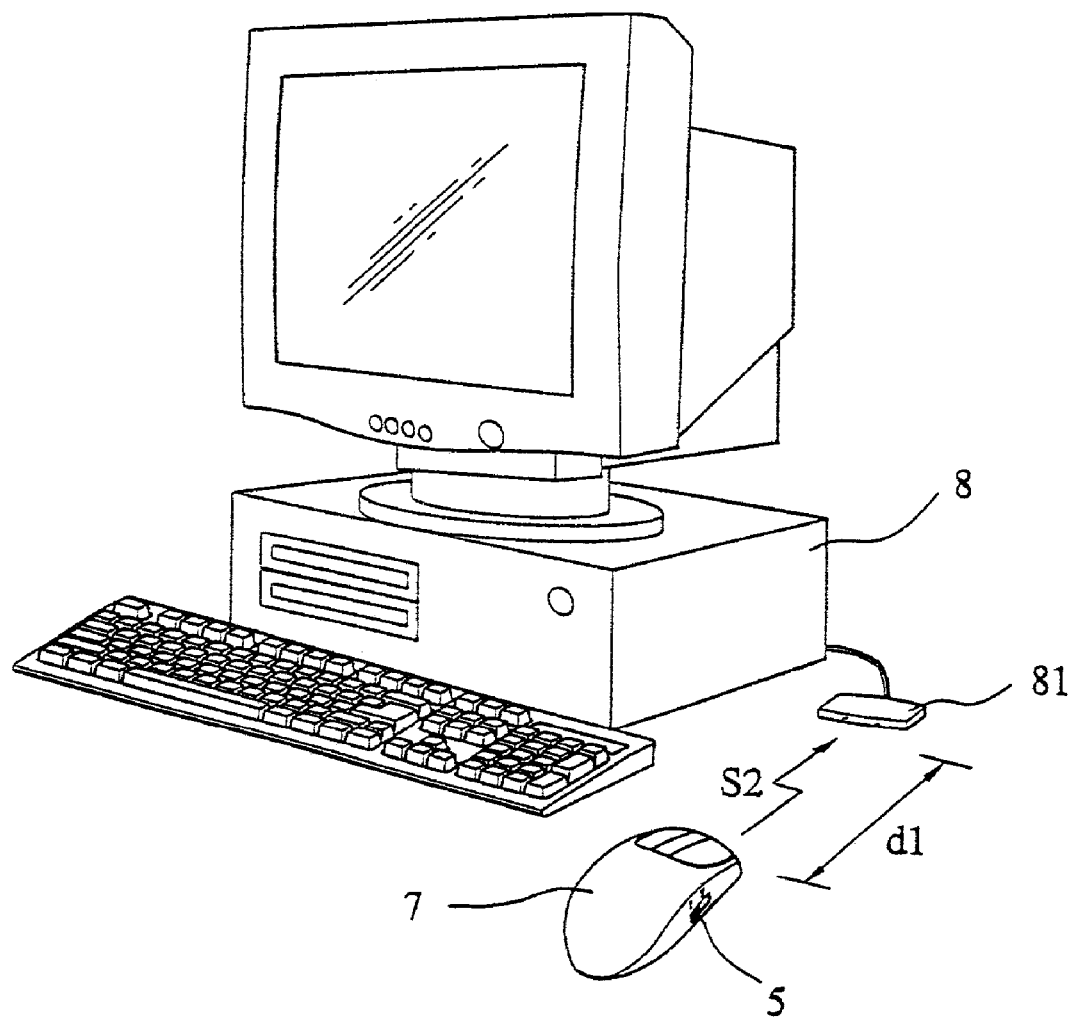
FIG. 2 shows the present invention is employed in a wireless signal transmission between a wireless mouse and a computer system, wherein a transmission distance from the wireless mouse to the computer system is short.
Figure 3:
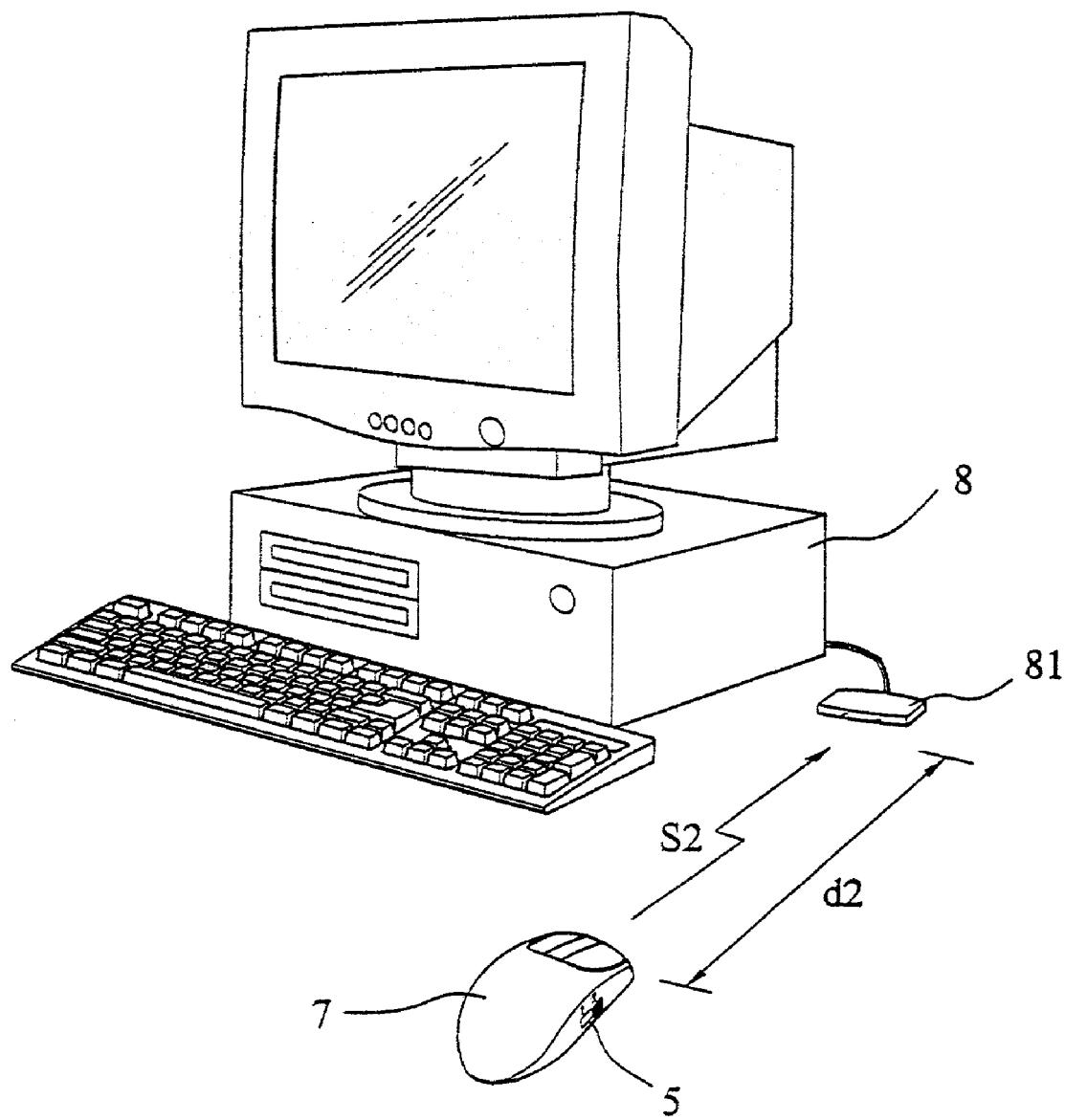
FIG. 3 shows the present invention is employed in a wireless signal transmission between a wireless mouse and a computer system, wherein a transmission distance from the wireless mouse to the computer system is long.

When the present invention is employed in a computer system 8, as shown in FIG. 2, a RF signal S2 emitted from a wireless mouse 7 is received by a RF signal receiver 81 externally connected to or directly built in the computer system 8. When a distance d1 between the wireless mouse 7 and the RF signal receiver 81 is short, a user could manually switch the power-setting unit 5 provided on the wireless mouse 7 to a first position that actuates a smaller transmission power. And, when a distance d2 between the wireless mouse 7 and the RF signal receiver 81 is long, as shown in FIG. 3, the user could manually switch the power-setting unit 5 provided in the wireless mouse 7 to a second position that actuates a larger transmission power.

Of course, the power-setting unit 5 may also be automatically switched through an automatic detecting function designed for the unit 5. Since the automatic detection or the automatic switching is a known electronic detection structure, it is not discussed in more details herein.

Moreover, when the same input device is used in different environments, for example, on working surfaces made of different materials, such as a wooden desktop or a steel desktop, or when a plurality of wireless devices seriously interfere with one another, it is also possible to employ the present invention to select a proper transmission power to enable normal operation of the wireless device. In this manner, the problems of high power consumption and mutual interference caused by overstrong transmission signals could be avoided.

Figure 4:
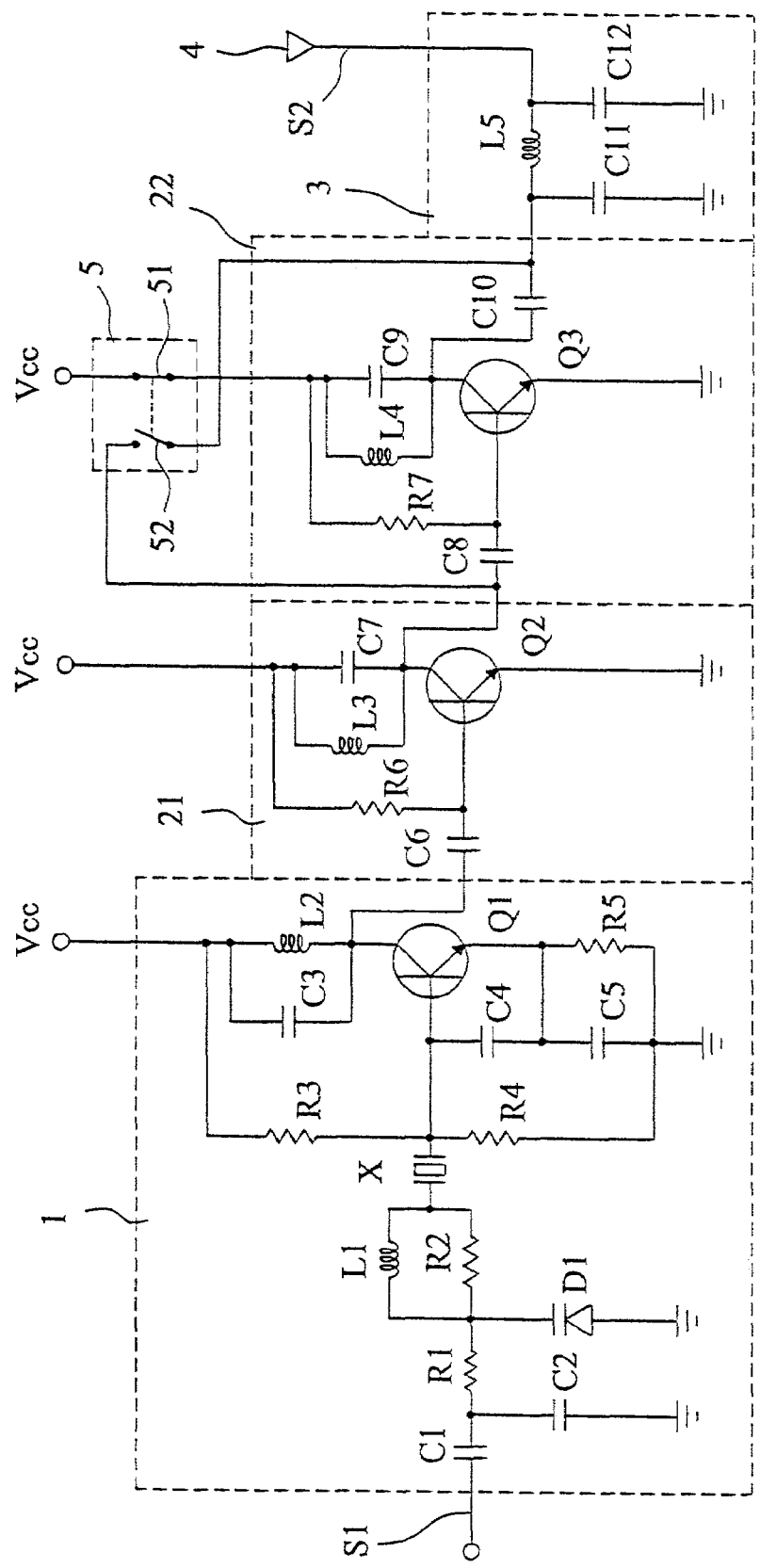
FIG. 4 is a detailed control circuit diagram according to a preferred embodiment of the present invention.

FIG. 4 is a detailed control circuit diagram according to a preferred embodiment of the present invention. The signal modulator-oscillator stage 1 mainly provides two functions, that is, signal modulation and oscillation. A modulation circuit included in the signal modulator-oscillator stage 1 consists of capacitances C1 and C2, resistances R1 and R2, an inductance L1, and a diode D1. And, an oscillation circuit included in the signal modulator-oscillator stage 1 consists of an oscillator X, resistances R3, R4 and R5, capacitances C3, C4 and C5, an inductance L2, and a transistor Q1.

In the illustrated circuit diagram, the cascade power amplification circuit 2 consists of two cascade-connected power stages 21, 22. The first power stage 21 consists of capacitances C6 and C7, a resistance R6, an inductance L3, and a transistor Q2. A collector of the transistor Q1 in the oscillation circuit serves as an output of the signal modulator-oscillator stage 1 and is connected to a base of the transistor Q2 in the first power stage 21 of the cascade power amplification circuit 2.

The second power stage 22 consists of capacitances C8, C9 and C10, a resistance R7, an inductance L4, and a transistor Q3. A collector of the transistor Q3 serves as an output of the second power stage 22 and is connected to the filter circuit 3. The filter circuit 3 consists of capacitances C11 and C12, and an inductance L5, and is connected to the antenna 4.

The power-setting unit 5 includes a power switch 51 and a bypass switch 52. In the case of a multi-stage power amplification circuit, the number of the power switches 51 and of the bypass switches 52 increase corresponding to the number of power stages included in the multi-stage power amplification circuit. The power switch 51 is serially connected to a power source input of a corresponding power stage to decide whether a power source Vcc is supplied to the power stage. The bypass switch 52 is parallelly connected to the power stage between an input and an output of the power stage to serve as a by-path of the signal. The power switch 51 and the bypass switch 52 are complimentarily switched. In other words, when the power switch 51 is closed (ON), the bypass switch 52 is opened (OFF); and when the power switch 51 is opened (OFF), the bypass switch 52 is closed (ON).

Therefore, the power-setting unit 5 enables a user to decide how many power stages in the cascade power amplification circuit 2 are to be included in a desired power amplification. When the wireless transmission distance is long, more than one power stage may be set to execute the power amplification. And, when the wireless transmission distance is short, fewer number of power stages may be set for the power amplification. That is, when a stronger transmission power is required, all the power stages may be set for use; and when a less stronger transmission power is required, either the first or the second power stage may be set to power-off and the signal is bypassed to the filter circuit 3.

From the above description of the preferred embodiment of the present invention, it is understood the present invention provides a wireless transmission circuit that enables modulation of RF power amplification, so that a user may select a lower transmission power when using a wireless input device within a short transmission distance, and select a larger transmission power when the transmission distance is long. In this manner, the battery in the wireless device may have an extended usable life.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A wireless transmission circuit enabling modulation of RF power amplification, comprising:
    a signal modulator-oscillator circuit for receiving and modulating a signal data output by a signal processing circuit;
    a cascade power amplification circuit including a plurality of power stages for receiving a signal data modulated and output by said signal modulator-oscillator stage, and power of said received modulated signal data being amplified at one or more of said plurality of power stages; and
    a power-setting unit for setting a specific number of said power stages in said cascade power amplification circuit to be included in said power amplification of said received modulated signal according to a required transmission power and a transmission distance; and said signal data having been power-amplified at said one or more power stages being further processed and then emitted at an antenna to be received by a remote reception device;
    wherein said signal processing circuit may be a signal processing circuit for any one of a mouse, a keyboard, a joystick, a track ball, a game controller, a digital signal camera/PC camera, and a digital signal video camera/PC video camera for generating said signal data;

wherein said signal data having been power-amplified at said one or more power stages is further processed with a filter circuit and then emitted at said antenna; and further wherein said power-setting unit includes at least one power switch and at least one bypass switch, and said bypass switch is in a number corresponding to that of said power switch; said at least one power switch being serially connected to a power input of a corresponding one of said power stages to decide whether said corresponding power stage is supplied with a power, and said at least one bypass switch being connected in parallel to said corresponding power stage between an input and an output thereof to serve as a bypass for said signal; and said power switch and said bypass switch for the same one of said power stages being complementarily switched on or off.

2. The wireless transmission circuit enabling modulation of RF power amplification as claimed in claim 1, wherein said at least one power switch and said at least one bypass switch of said power-setting unit are manually operated to switch on or off.

3. The wireless transmission circuit enabling modulation of RF power amplification as claimed in claim 1, wherein said at least one power switch and said at least one bypass switch of said power-setting unit are automatically operated to switch on or off.

* * * * *